(12) United States Patent
Urabe

(10) Patent No.: US 6,407,003 B2
(45) Date of Patent: Jun. 18, 2002

(54) FABRICATION PROCESS OF SEMICONDUCTOR DEVICE WITH TITANIUM FILM

(75) Inventor: Koji Urabe, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/010,187

(22) Filed: Jan. 21, 1998

(30) Foreign Application Priority Data

Jan. 23, 1997 (JP) .............................................. 9-010390

(51) Int. Cl.[7] .............................................. H01L 21/302
(52) U.S. Cl. .................... 438/720; 706/627; 706/630; 706/648; 706/649
(58) Field of Search ................................ 438/706, 710, 438/720, 627, 630, 648, 649

(56) References Cited

U.S. PATENT DOCUMENTS

| | | | | |
|---|---|---|---|---|
| 4,878,994 A | * | 11/1989 | Jucha et al. ................. | 156/643 |
| 5,126,288 A | * | 6/1992 | Nakagawa ................... | 437/228 |
| 5,312,774 A | * | 5/1994 | Nakamura et al. .......... | 437/192 |
| 5,393,565 A | * | 2/1995 | Suzuki et al. ............. | 427/255.2 |
| 5,401,674 A | * | 3/1995 | Anjum et al. ................ | 437/190 |
| 5,508,066 A | | 4/1996 | Akahori | |
| 5,702,970 A | * | 12/1997 | Choi ............................ | 437/52 |
| 5,846,886 A | * | 12/1998 | Hattori et al. ............... | 438/740 |
| 5,880,500 A | * | 3/1999 | Iwata et al. .................. | 257/336 |
| 5,960,319 A | * | 9/1999 | Iwata et al. .................. | 438/664 |
| 6,080,667 A | * | 6/2000 | Urabe .......................... | 438/659 |
| 6,174,805 B1 | * | 1/2001 | Urabe .......................... | 438/648 |
| 6,225,213 B1 | * | 5/2001 | Urabe .......................... | 438/627 |

FOREIGN PATENT DOCUMENTS

| | | | |
|---|---|---|---|
| JP | 1244615 | * | 9/1989 |
| JP | 2241033 | * | 9/1990 |
| JP | 5211134 | * | 8/1993 |
| JP | 5291179 | * | 11/1993 |
| JP | 5315297 | * | 11/1993 |
| JP | 7-41948 | | 2/1995 |
| JP | 7-99174 | | 4/1995 |
| JP | 7-297136 | | 11/1995 |
| JP | 8-115886 | | 5/1996 |
| JP | 63012132 | * | 1/1998 |
| JP | 10-189488 | * | 7/1998 |

* cited by examiner

Primary Examiner—Benjamin L. Utech
Assistant Examiner—Charlotte A. Brown
(74) Attorney, Agent, or Firm—Foley & Lardner

(57) ABSTRACT

A fabrication process of a semiconductor device with a titanium film includes the steps of forming a titanium film on a substrate by way of a chemical vapor deposition method; and removing titanium deposited within a reaction chamber forming the titanium film by a gas containing halogen, following the titanium film forming step.

10 Claims, 6 Drawing Sheets

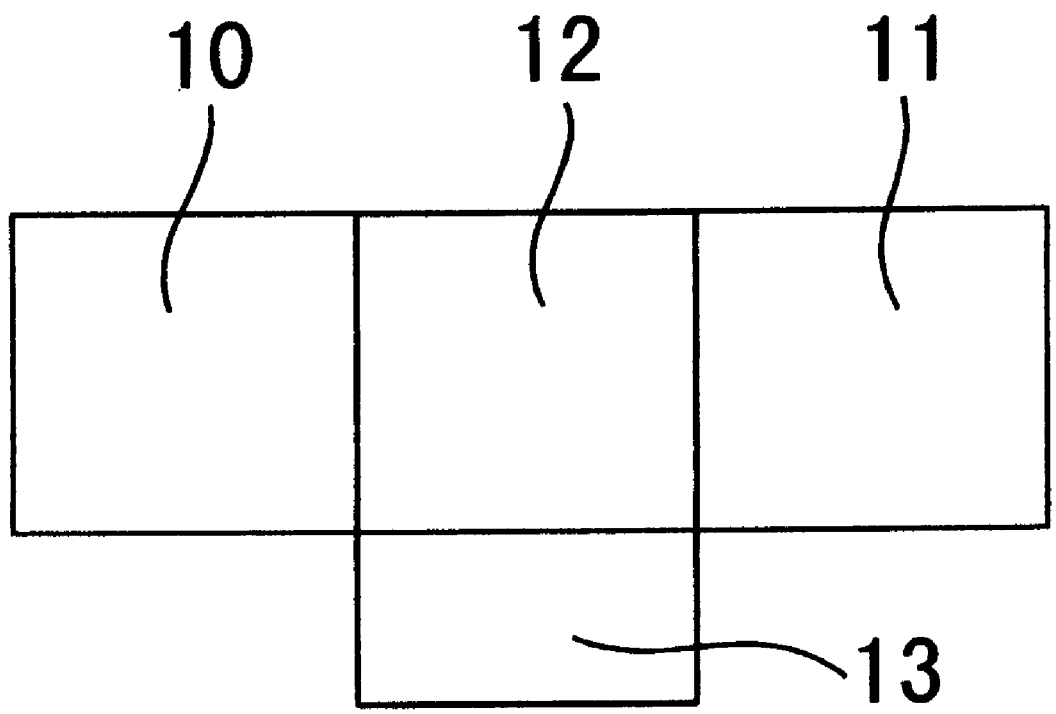

FABRICATION PROCESS OF SEMICONDUCTOR DEVICE WITH TITANIUM FILM

BACKGROUND OF THE INVENTION

1. Field of the Invention

The present invention relates generally to a semiconductor device with a titanium film and a fabrication process thereof. More specifically, the invention relates to an improvement in and relating to a process of forming a barrier metal using a chemical vapor deposition.

2. Description of the Related Art

Down-sizing and increasing of package density of semiconductor device has still been furiously progressed. At the present, a prototype of ultra-highly integrated semiconductor devices, such as memory devices, logic devices or so forth, designed according to a dimensional standard of about 0.15 μm, have been fabricated. A diameter of a contact hole associating with increasing of package density of such semiconductor device is further reduced. On the other hand, a depth of the contact hole is difficult to reduce for requirement of a wiring resistance or capacity. Therefore, in the recent years, an aspect ratio of the contact hole is abruptly increasing. Associating therewith, a barrier metal layer is normally provided at least in a bottom portion of the contact hole. The barrier metal layer has a function to prevent mutual dispersion of silicon into a metal forming a metal wiring and a diffusion layer of silicon and to prevent increasing of a contact resistance.

As a method of fabricating the barrier metal in the contact hole, attention has been recently attracted to a chemical vapor deposition method. Hereinafter, as one example of a conventional method, discussion will be given with reference to FIG. 1. At first, as shown in FIG. 1(A), an isolative oxide layer 2 in a thickness of 200 nm is formed on a silicon substrate 1, and a predetermined impurity is implanted into the silicon substrate 1 to form a diffusion layer 3. Subsequently, an insulative film in a thickness of 1500 nm is formed. On a diffusion layer 3, a connection hole 5 is opened. Next, a titanium silicide film is formed using a chemical vapor deposition apparatus having a reaction chamber 10, 11, a transporting chamber 12 and a load lock chamber 13, as shown in FIG. 3. One example of the reaction chamber is shown in FIG. 4. In FIG. 4, the reference numeral 14 denotes an upper electrode, 15 denotes a semiconductor substrate, 16 denotes a substrate holder, 17 denotes a resistance heater and 18 denotes an exhaust line.

Namely, as shown in FIG. 1(B), a titanium film 6 in a thickness of 10 nm is formed on an insulative film 4, and a titanium silicide film 7 in a layer thickness of 20 nm is formed on the diffusion layer 3 is formed, by a chemical vapor deposition method employing titanic chloride, hydrogen, argon as a material gas. Furthermore, as shown in FIG. 1(C), in a reaction chamber 11 shown in FIG. 3, a titanium film 6 on the insulative film 1 is nitrided by ammonia for forming a titanium nitride film 8. Then, as shown in FIG. 1(D), a titanium nitride layer 9 in a thickness of 500 nm is formed on the titanium nitride layer 8 and the titanium silicide film 7 using chemical vapor deposition method employing titanic chloride, ammonia, nitrogen as a material gas. Through the process set forth above, the barrier layer is formed in a contact hole.

However, the conventional fabrication process of semiconductor device set forth above encounters the following problems. Since the titanium film is formed in the reaction chamber 10 and nitriding of titanium and deposition of titanium nitride are performed in the reaction chamber 11. Upon formation of the titanium film in the reaction chamber 10, titanium is deposited on portions other than the semiconductor substrate, namely the substrate holder, the upper electrode shown in FIG. 4 and an inner wall of the reaction chamber. The deposited titanium is etched by titanic chloride gas as the material gas to generate $TiCl_x$ to supply an excessive titanium chloride on the substrate. Therefore, a partial pressure of titanium chloride may be varied depending upon number of substrate to be processed, a desired partial pressure cannot be obtained to vary the titanium film forming speed on the semiconductor substrate. Accordingly, it has been difficult to obtain electric characteristics of the stable contact electrode in the foregoing method.

SUMMARY OF THE INVENTION

It is an object of the present invention to provide a fabrication process of a semiconductor device with a titanium film, which can achieve stable titanium film forming speed by avoiding supply of titanium chloride generated by etching of titanium, to a semiconductor substrate and thus by obtaining a desired titanic chloride, and whereby can achieve stable electric characteristics of a contact electrode.

Another object of the present invention is to provide a fabrication process of a semiconductor device with a titanium film, in which a formation step of a titanium nitride film can be performed in a common chamber to formation of the titanium film. A further object of the present invention is to provide a fabrication process of a semiconductor device, which can nitride a residual titanium after removal for further suppress excessive titanium chloride to a substrate by titanium etching, for further stabilizing the titanium film forming speed.

According to the first aspect of the present invention, a fabrication process of a semiconductor device with a titanium film comprises the steps of:

forming a titanium film on a substrate by way of a chemical vapor deposition method; and removing titanium deposited within a reaction chamber forming the titanium film by a gas containing halogen, following the titanium film forming step.

According to the second aspect of the present invention, a fabrication process of a semiconductor device with a titanium film comprises the steps of:

forming a titanium film on a substrate by way of a chemical vapor deposition method; and removing titanium deposited within a reaction chamber forming the titanium film and on a semiconductor substrate by a gas containing halogen, following the titanium film forming step.

According to the present invention, since the titanium deposited on the inside of the reaction chamber can be removed, stable titanium forming speed can be obtained. This is because that supply of deposited titanium nitride which is generated by etching of the deposited titanium. Thus, the partial pressure of titanic chloride can be obtained to stabilize electric characteristics of the contact electrode can be achieved.

It should be noted that the wording "inside of the reaction chamber" represents a substrate holder, an upper electrode and an inner peripheral wall of the reaction chamber. Also, the gas containing halogen may be selected among chlorine, chloride, fluorine, fluoride, bromine, bromine compound, iodine, iodine compound and the like, for example. A condition, such as process period and so forth upon removal of titanium film by halogen containing gas is not specified. Therefore, the condition may be selected so that titanium deposited on the inside of the reaction chamber may be removed in the extent that the residual titanium on the inside of the reaction chamber may not cause problem in practical use.

In the preferred construction fabrication process of a semiconductor device may further comprise step of forming a titanium nitride film on a semiconductor substrate by way of chemical vapor deposition method within the reaction chamber, after the removing step.

Formation of the titanium nitride film may be performed in the reaction chamber common to formation of the titanium film, or in the alternative, in the reaction chamber different from that used for forming the titanium film. In the conventional process, the titanium deposited in the reaction chamber is etched by the material gas upon formation of the titanium nitride film to generate $TiCl_x$ or the like to cause peeling off of a Ti film on the substrate. Therefore, in the conventional process, it was essential to use different reaction chambers in formation of the titanium film and the titanium nitride film. In contrast to this, according to the present invention, since titanium deposited in the reaction chamber can be removed by halogen containing gas, $TiCl_x$ or the like will never be generated during process of formation of the titanium nitride film. Therefore, the single reaction chamber can be used in common for formation of the titanium film and titanium nitride film.

When formation of the titanium film and formation of the titanium nitride film are performed in a common reaction chamber, supply of excessive titanium chloride to the semiconductor substrate can be further suppressed. Namely, after removal of titanium of the inside of the reaction chamber, even if the residual titanium left inside of the reaction chamber, such residual titanium can be nitrided to avoid titanium etching by titanic chloride. Accordingly, the titanium film formation can be further stabilized.

A fabrication process of a semiconductor device may further comprises a step of purging a halogen gas residing in the reaction chamber, after the removing step.

Purging of halogen containing gas can be done by high frequency discharge using argon and hydrogen, for example. Also, diboron, hydrogen phosphide, arsine or the like may be used.

Also, in the preferred construction, the gas containing halogen contains any one of $Cl_2$, HCl, HBr or $F_2$.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings:

FIG. 3 is a fragmentary illustration of a chemical vapor deposition apparatus.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessary obscure the present invention.

First Embodiment

Figure 1A:
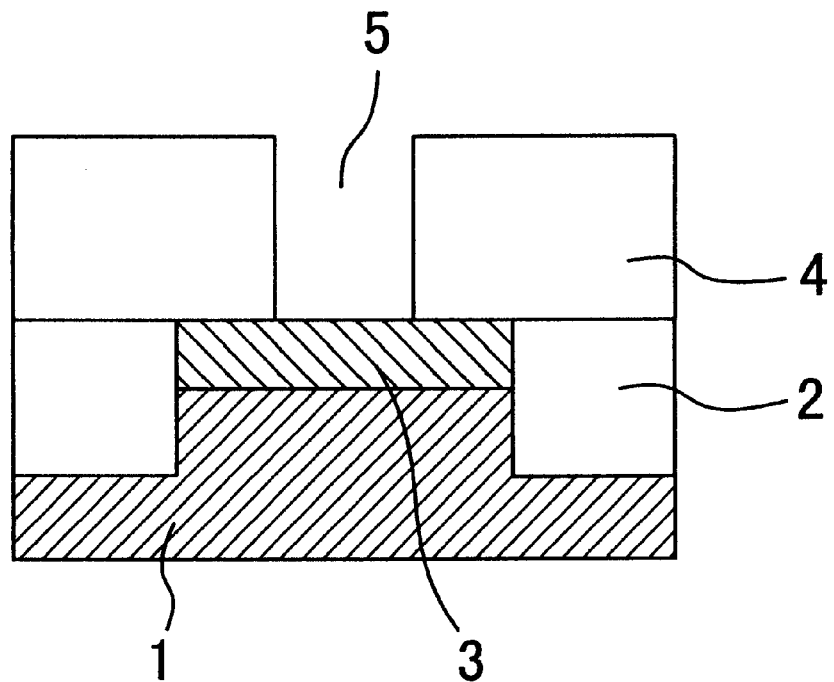
FIGS. 1(A) to 1(D) are diagrammatic section showing the first embodiment of a fabrication process of a semiconductor device according to the present invention, and the conventional fabrication process, illustrated in sequential order of fabrication process steps.
Figure 1B:
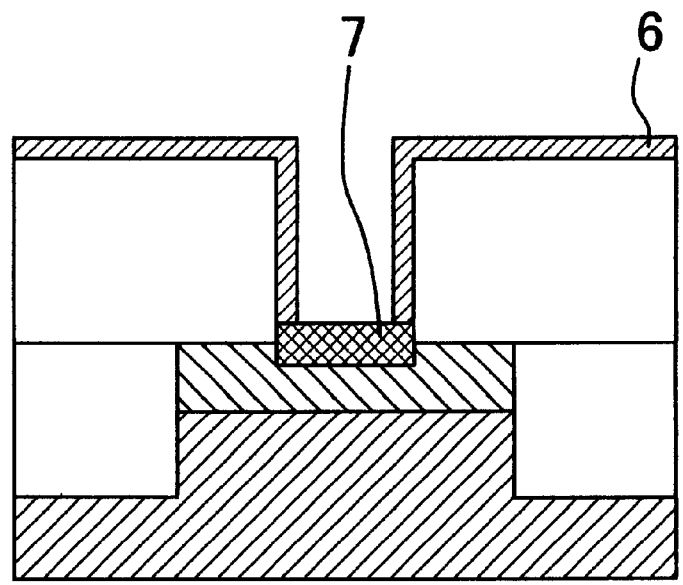
Figure 1C:
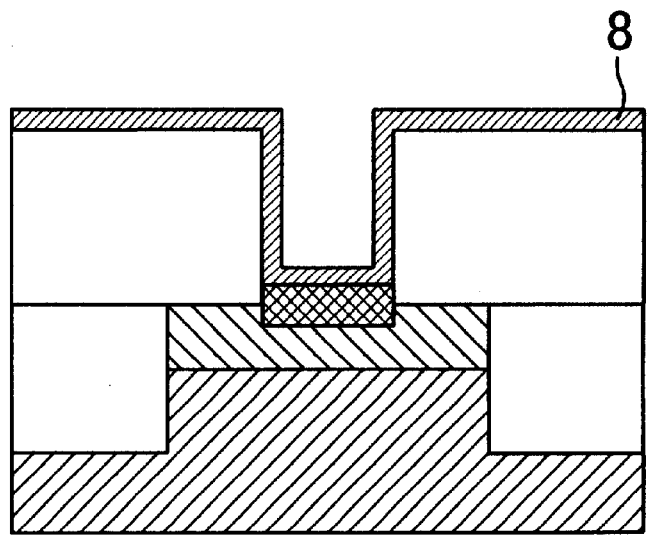
Figure 1D:
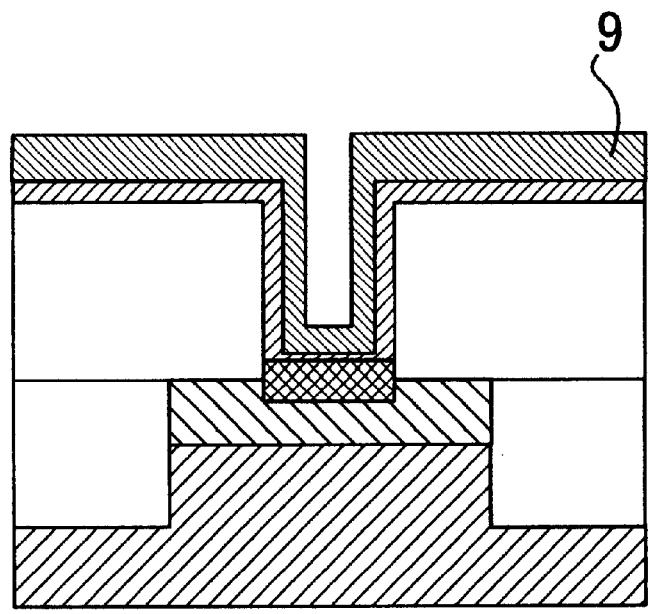
Figure 4:
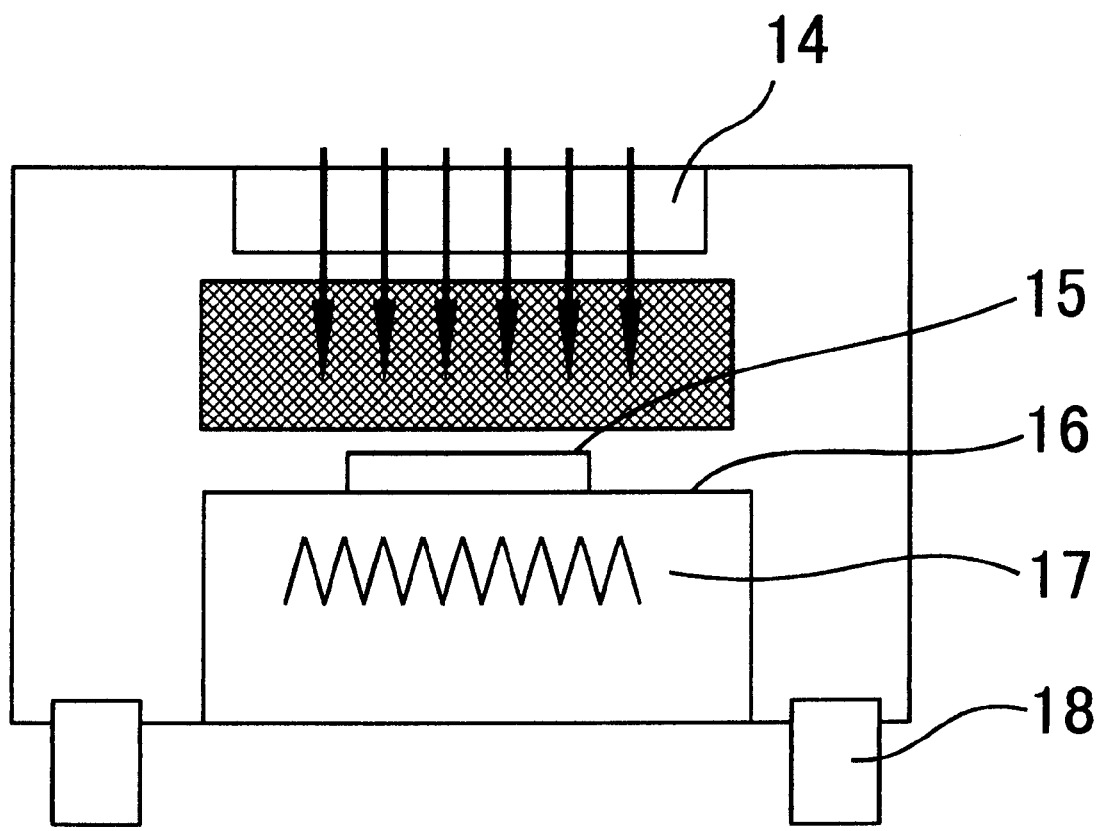
FIG. 4 is a fragmentary illustration of a reaction chamber of the chemical vapor deposition apparatus of FIG. 3.

Next, the first embodiment of a fabrication process of semiconductor device with a titanium film according to the present invention will be discussed with reference to FIG. 1. At first, as shown in FIG. 1(A), an isolative oxide film 2 in a thickness of 200 nm is formed on a silicon substrate 1. Then, a predetermined impurity is implanted in a silicon substrate 1 to form a diffusion layer 3. Subsequently, an insulative film 1 in a thickness of 1500 nm is formed and a connection hole 5 is opened on the diffusion layer 3. Next, by way of chemical vapor deposition method by means of a chemical vapor deposition apparatus shown in FIG. 3, a titanium silicide layer 7 is formed. A substrate holder, on which a semiconductor substrate is mounted, is protected by a material difficult to be etched by halogen, such as halide of quartz, silicon nitride, aluminum nitride, titanium nitride or the like. As shown in FIG. 1(B), a titanium silicide layer 7 in a thickness of 20 nm was formed on the titanium film 6 in the thickness of 10 nm and the diffusion layer 3 on the insulative layer 4 under a condition of 500° C. of a substrate temperature, 510 torr of pressure, a high frequency discharge output of 500 kw with using a mixture gas of 2 sccm of titanic chloride, 1000 sccm of hydrogen, 500 sccm of argon as a material gas. Next, after taking out the substrate from the reaction chamber 10, the titanium film 6 deposited on the substrate holder of the reaction chamber 10, an upper electrode (FIG. 4), an inner peripheral wall of the reaction chamber and so forth. An etching was performed employing a chlorine gas under a condition of a content of chloride is 100 sccm, 500° C. of a substrate temperature and 1 torr of pressure. After etching process, using high frequency discharge employing argon and hydrogen, a residual chloride on the semiconductor substrate and within the reaction chamber was purged under a condition of 500 sccm of argon, 1000 sccm of hydrogen, 500° C. of the substrate temperature, 1 torr of a pressure and 500 kW of high frequency discharge output. As a post process, ammonia plasma process may be used. Then, as shown in FIG. 1(C), in the reaction chamber 11 of FIG. 3, a titanium nitride film 8 was formed over the titanium film 6, on the insulative film 4 by nitriding process under a condition of 100 sccm of ammonia, 500° C. of the substrate temperature, 20 torr of the pressure, Subsequently, as shown in FIG. 1(D), in the reaction chamber 11, a titanium nitride film 9 in a thickness of 50 nm was formed under a condition of 600° C. of the substrate temperature and 20 torr of the pressure with taking a mixture gas of 40 sccm of titanic chloride, 100 sccm of ammonia and 3000 sccm of a nitrogen gas.

According to the shown embodiment of the fabrication process, in a titanium film forming reaction chamber, a titanium deposited was removed. Accordingly, it will never been caused supply of titanium chloride to the substrate depending upon the portion subjecting etching process, and whereby to permit to attain a desired partial pressure of titanic chloride. Thus, stable titanium film forming speed can be achieved. By this, the electrical characteristics of the contact electrode can be achieved.

Second Embodiment

Figure 2A:
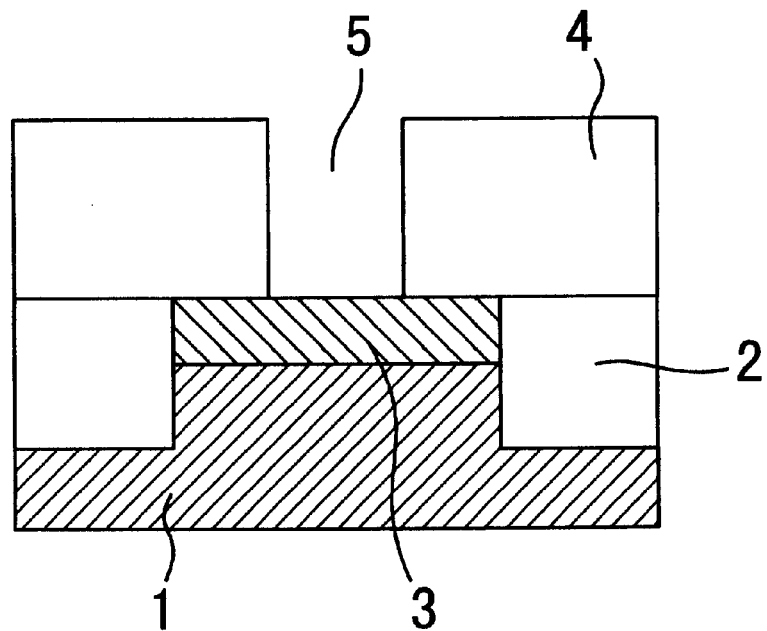
FIGS. 2(A) to 2(D) are diagrammatic section showing the second embodiment of a fabrication process of a semiconductor device according to the present invention, illustrated in sequential order of fabrication process steps.
Figure 2B:
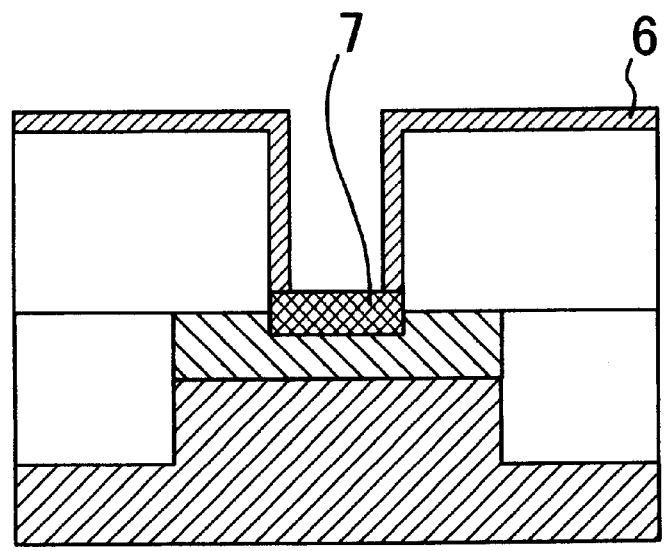
Figure 2C:
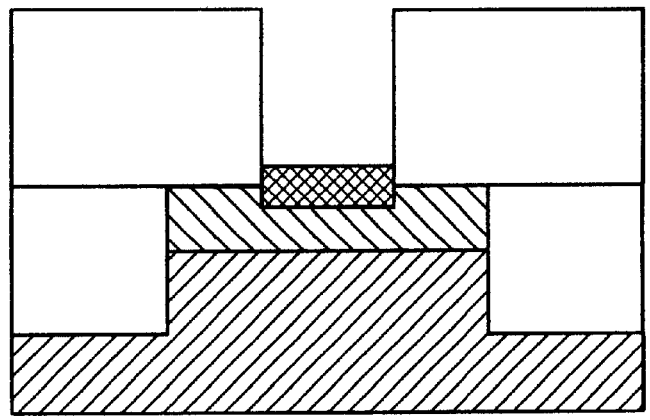
Figure 2D:
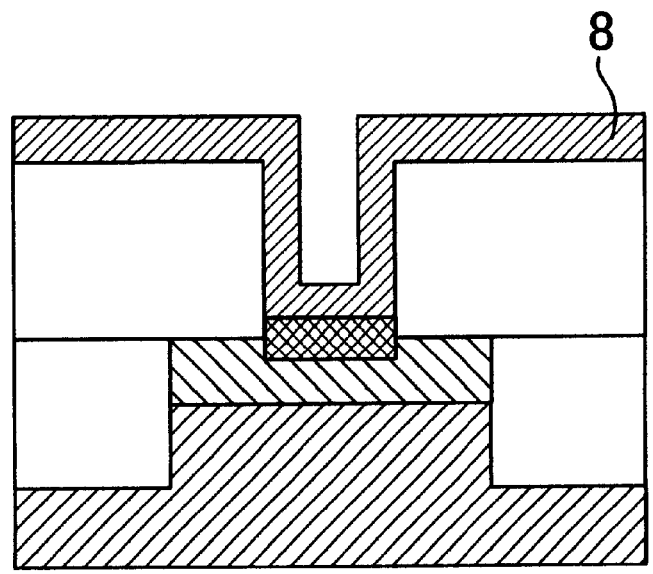

Next, the second embodiment of the fabrication process of the semiconductor device will be discussion with reference to FIGS. 2(A) to 2(D). As shown in FIG. 2(A), the isolative oxide film 2 and the diffusion layer 3 were formed on the silicon substrate 1, and a connection hole was opened. Thereafter, as shown in FIG. 2(B), the titanium silicide film 7 was formed. Subsequently, as shown in FIG. 2(C), the titanium film 6 on the insulative film 4 was removed under a condition of 100 sccm of chlorine, 500° C. of the substrate temperature and 1 torr of pressure. Here, the titanium film deposited on the portions other than the semiconductor substrate in the reaction chamber 10 was removed, simultaneously. While removal of titanium film in the reaction chamber was performed after taking out the substrate in the first embodiment, the titanium film on the substrate and the reaction chamber was removed simultaneously, in the shown embodiment. It should be noted that the titanium silicide film 7 formed on the substrate is etched little by the chlorine gas. After this etching process, the residual chlorine on the semiconductor substrate and within the reaction chamber was removed under a condition of 500 sccm of argon, 1000 sccm of hydrogen, 500° C. of the substrate temperature, 1 torr of the pressure, and 500 kW of high frequency discharge output. As a post process, ammonia plasma process may be performed. Next, as shown in FIG. 2(D), employing the chemical vapor deposition method in the reaction chamber 11, a titanium nitride film in a thickness of 50 nm was formed on the insulative film 4 and the titanium silicide film 6. Deposition condition was 600° C. of the substrate temperature and 20 torr of the pressure with taking a mixture gas 40 sccm of titanic chloride, 100 sccm of ammonia, 3000 sccm of nitrogen, as the material gas.

With the shown embodiment of the fabrication process of the semiconductor device, in the reaction chamber for forming the titanium film, titanium deposited is removed by chlorine gas. Accordingly, supply of titanium chloride which is caused by etching of the deposited titanium otherwise, will never be caused. Thus, the desired partial pressure of titanic chlorine can be obtained, and whereby a stable titanium film formation speed can be achieved. As a result, an electrical characteristic of the contact electrode can be stabilized.

Third Embodiment

The third embodiment of the fabrication process of the semiconductor device according to the present invention will be discussed with reference to FIGS. 2(A) to 2(D). At first, similarly to the second embodiment, the process steps illustrated in FIGS. 2(A) to 2(B) were performed. Namely, the isolative oxide film 2 and the diffusion layer 3 were formed on the silicon substrate 1, and a connection hole was opened. Thereafter, titanium film was removed by chlorine gas, and in conjunction therewith, titanium within the reaction chamber was removed. Subsequently, within the reaction chamber, chemical vapor deposition method was performed to form the titanium nitride layer 8 was firmed in a thickness of 50 nm on the insulative film and titanium silicide layer 6 (FIG. 2(D)) The foregoing process was performed after shifting the substrate into the reaction chamber 11 in the second embodiment, the shown embodiment performs those process in the same reaction chamber. Namely, with taking a mixture gas of 40 sccm of titanium chloride, 100 sccm of ammonia and 3000 sccm of nitrogen, the deposition condition is 600° C. of the substrate temperature, 20 torr of the pressure.

By the shown embodiment of the semiconductor device, formation of titanium film and formation of the titanium nitride are performed within the same reaction chamber. Therefore, the residual titanium is nitirided after removal by halogen containing gas. Thus, excessive supply of the titanium chloride to the substrate, can be restricted. By this, the titanium film fabricating process can be further stabilized.

As set forth above, by the fabrication process of the semiconductor device according to the present invention, since the titanium deposited within the reaction chamber can be removed, stable titanium forming speed can be obtained. This is because that supply of deposited titanium nitride which is generated by etching of the deposited titanium. Thus, the partial pressure of titanic chloride can be obtained to stabilize electric characteristics of the contact electrode can be achieved.

Also, by taking the foregoing description, it becomes possible to perform the formation step of the titanium chloride in common smaller the same or common reaction chamber. Namely, in the conventional configuration the titanium deposited within the reaction chamber in the reaction chamber is etched by the material gas, such as titanic chloride, upon formation of the titanium nitride to generate $TiCl_x$. In contrast to this, according to the present invention, since the deposited titanium in the reaction chamber is removed by the gas containing halogen, no problem will be arisen by using the same or common chamber. Therefore, the fabrication process can be done by only one reaction chamber.

Furthermore, by performing formation of titanium film and formation of titanium nitride film in the common reaction chamber, the residual titanium can be nitrided by the gas containing halogen to further restrict supply of titanium chloride to the substrate by etching of titanium by the titanic chloride gas. Accordingly, the titanium film formation speed can be further stabilized.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A fabrication process of a semiconductor device with a titanium film comprising:

forming a titanium silicide film on a substrate in a reaction chamber by way of a chemical vapor deposition method, during which titanium is deposited on the inside of the reaction chamber; and then simultaneously removing the titanium deposited on the inside of said reaction chamber and portions of titanium film from said substrate with a gas containing halogen while leaving said titanium silicide film on said substrate while said substrate remains in said reaction chamber.

2. A fabrication process of a semiconductor device as set forth in claim 1, which further comprises forming a titanium nitride film on a semiconductor substrate by way of chemical vapor deposition method within said reaction chamber, after removing said titanium.

3. A fabrication process of a semiconductor device as set forth in claim 1, which further comprises forming a titanium nitride film on said semiconductor substrate employing chemical vapor deposition method in a reaction chamber different from said reaction chamber after removing said titanium.

4. A fabrication process of a semiconductor device as set forth in claim 1, which further comprises purging a halogen gas residing in said reaction chamber, after removing said titanium.

5. A fabrication process of a semiconductor device as set forth in claim 4, wherein said halogen gas residing within said reaction chamber is purged by a high frequency discharge employing argon and hydrogen.

6. A fabrication process of a semiconductor device as set forth in claim 2, wherein said gas containing halogen contains any one of $Cl_2$, HCl, HBr or $F_2$.

7. A fabrication process of a semiconductor device as set forth in claim 1, comprising simultaneously removing titanium deposited on the inside of said reaction chamber and removing portions of titanium film from said substrate while leaving said titanium silicide film on said substrate.

8. A process for fabricating a semiconductor device having a titanium film according to claim 1, additionally comprising subsequently forming a titanium nitride film on said substrate.

9. A process as claimed in claim 8, wherein said titanium film formed on said substrate is a titanium silicide film, said substrate remains in said reaction chamber while titanium is removed from the inside of the reaction chamber, and said subsequently formed film is a titanium nitride film.

10. A process according to claim 1, wherein said halogen is chlorine.

* * * * *